(12) United States Patent
Narita

(10) Patent No.: US 8,101,529 B2
(45) Date of Patent: Jan. 24, 2012

(54) CARBON NANOTUBE RESISTOR, SEMICONDUCTOR DEVICE, AND MANUFACTURING METHOD THEREOF

(75) Inventor: Kaoru Narita, Tokyo (JP)

(73) Assignee: NEC Corporation, Tokyo (JP)

( * ) Notice: Subject to any disclaimer, the term of this patent is extended or adjusted under 35 U.S.C. 154(b) by 143 days.

(21) Appl. No.: 12/526,245

(22) PCT Filed: Jan. 18, 2008

(86) PCT No.: PCT/JP2008/050640
§ 371 (c)(1),
(2), (4) Date: Sep. 14, 2009

(87) PCT Pub. No.: WO2008/099638
PCT Pub. Date: Aug. 21, 2008

(65) Prior Publication Data
US 2010/0320569 A1    Dec. 23, 2010

(30) Foreign Application Priority Data

Feb. 15, 2007  (JP) .................. 2007-035250

(51) Int. Cl.
*H01L 21/82* (2006.01)
(52) U.S. Cl. ......... 438/780; 257/E21.052; 257/E21.268; 257/E21.279; 257/E21.293; 438/799; 977/961
(58) Field of Classification Search ............... 438/20, 438/799, 780; 257/E21.052, 268, 279, 293; 977/742, 961
See application file for complete search history.

(56) References Cited

U.S. PATENT DOCUMENTS

| 7,473,651 | B2 * | 1/2009 | Moriya et al. ............... 438/780 |
| 7,501,108 | B2 * | 3/2009 | Yerushalmi-Rozen et al. ............. 423/447.1 |
| 7,744,947 | B2 * | 6/2010 | Lee et al. ...................... 427/58 |
| 7,812,510 | B2 * | 10/2010 | Minami ...................... 313/292 |
| 2004/0043219 | A1 * | 3/2004 | Ito et al. ...................... 428/408 |
| 2006/0293093 | A1 * | 12/2006 | Marcus .................... 455/575.3 |
| 2007/0111628 | A1 * | 5/2007 | Yagi et al. ...................... 445/24 |
| 2009/0096348 | A1 * | 4/2009 | Liu et al. ...................... 313/498 |
| 2009/0258448 | A1 * | 10/2009 | Xiao et al. ................... 438/20 |
| 2010/0230400 | A1 * | 9/2010 | Feng et al. ................... 219/546 |

FOREIGN PATENT DOCUMENTS

| JP | 2002110402 A | 4/2002 |
| JP | 2002346996 A | 12/2002 |
| JP | 2003081622 A | 3/2003 |
| JP | 2003162954 A | 6/2003 |

(Continued)

OTHER PUBLICATIONS

International Search Report for PCT/JP2008/050640 mailed Mar. 4, 2008.

*Primary Examiner* — Michael Lebentritt

(57) ABSTRACT

A process for producing a carbon nanotube resistor that is capable of providing a highly reliable resistor or fuse. The process comprises the step of introducing a carbon nanotube in a volatile solvent to a first concentration and conducting ultrasonic treatment thereof to thereby obtain an initial solution; the dilution step of stepwise diluting the initial solution with a volatile solvent under ultrasonication so as to adjust the same to a second concentration, thereby obtaining a coating solution; and the step of applying the coating solution between a first electrode and a second electrode, wherein the first concentration is $1(E10^{-4})$ g/ml or higher and the second concentration lower than $1(E10^{-5})$ g/ml.

12 Claims, 9 Drawing Sheets

FOREIGN PATENT DOCUMENTS

| | | |
|---|---|---|
| JP | 2004053424 A | 2/2004 |
| JP | 2005072209 A | 3/2005 |
| JP | 2005075661 A | 3/2005 |
| JP | 2005507146 A | 3/2005 |
| JP | 2006269588 A | 10/2006 |
| WO | 2006043329 A | 4/2006 |

* cited by examiner

A - A'

CARBON NANOTUBE RESISTOR, SEMICONDUCTOR DEVICE, AND MANUFACTURING METHOD THEREOF

The present application is the National Phase of PCT/JP2008/050640, filed Jan. 18, 2008, which claims priorities on convention based on Japanese Patent Application 2007-035250 filed Feb. 15, 2007. The Disclosures thereof are incorporated herein by reference.

TECHNICAL FIELD

The present invention relates to a carbon nanotube resistor, a semiconductor device, and manufacturing methods thereof.

BACKGROUND ART

As a resistor provided in a micro electric circuit such as a semiconductor device, a longitudinal nano-fuse and a nano-resistor circuit element are disclosed in Japanese Laid-Open Patent Application No. JP-P2003-162954A. FIG. 1 is a view showing a structure disclosed in JP-P2003-162954A. In this structure, a longitudinal conductive spacer 30, which is formed between a top conductor 60 and a bottom conductor 10, acts as a resistor or a fuse. It is described that materials such as metals, alloys, and semiconductors can be used as the resistor (spacer 30).

In case where the resistor such as metals, alloys, and semiconductors are used as the fuse, reliability may be poor. Specifically, when the fuse is burned out by passing an electric current, a burned out part may be linked again by melted materials. Additionally, an electromigration or a stressmigration may result in a disconnection of a fuse that is not scheduled to be burned out. Providing a resistor having a high reliability is requested.

Also, in order to obtain a structure in which the resistor is embedded in a via hole as shown in FIG. 1, processes such as a damascene process, a wet etching process, and a reactive etching, are required. A manufacturing method is complex. Therefore, decreasing a number of manufacturing processes is requested.

Moreover, a high temperature (over 100 degree) process such as CVD is required when a thin film made of metals, alloys, and the like is formed on a substrate as the resistor. By the high temperature process, characteristics of a transistor and the like included in a circuit may be changed. Also, when the substrate is made of a material having low resistance against heat such as a plastic, the substrate may be damaged by heat. Therefore, the resistor made of metals, alloys, semiconductors and the like can not be easily formed on an upper layer of an integrated circuit or a plastic substrate.

In order to attain the requests described above, carbon nanotubes are watched with keen interest as the resistor. In order to obtain a resistor made of the carbon nanotubes, coating a carbon nanotube dispersion solution on a substrate and drying are only needed. The high temperature process is not required, and the number of manufacturing processes can be decreased.

When the carbon nanotubes are used as the resistor, the carbon nanotubes are required to be uniformly dispersed. However, the carbon nanotubes have high cohesive force and easily cohere in a coating solvent. Thus, the carbon nanotubes are not easy to be dispersed uniformly in the resistor.

As a related art, Japanese Laid-Open Patent Application No. JP-P2005-7561A discloses a carbon nanotube dispersion solution in which carbon nanotubes and a non-ionic surfactant are mixed in an amide type polarity organic solvent.

Also, Japanese Laid-Open Patent Application No. JP-P2002-346996A discloses, removing a dispersion solvent from a highly concentrated dispersion solution in which carbon nanotubes are dispersed in the dispersion solvent that has low viscosity, and thereby forming an electric and/or magnetic network in the carbon nanotubes. It is described that a concentration of the carbon nanotubes in the highly concentrated dispersion solution is within a range between 1 and 10 g/liter.

Also, Japanese Laid-Open Patent Application No. JP-P2005-72209A discloses, mixing carbon nanotubes in a cross-linkable coating solution, curing the solution after coating, thereby obtaining a carbon nanotube structure that has a mesh structure in which a plurality of carbon nanotube is mutually cross linked.

However, even if the techniques described above are used, uniformness of dispersion in the carbon nanotubes is limited. A technique for dispersing the carbon nanotubes more uniformly is desired. Also, even it the techniques described above are used, reliability of a resistor acting as a fuse can not be necessarily enhanced.

DISCLOSURE OF INVENTION

Therefore, an object of the present invention is providing a manufacturing method of a carbon nanotube resistor in which carbon nanotubes are dispersed uniformly.

The manufacturing method of the carbon nanotube resistor according to the present invention includes, a process for making an initial solution by introducing carbon nanotubes into a volatile solvent to be a first concentration and executing ultrasonic treatment, a process for making a coating solution by stepwise diluting the initial solution with a volatile solvent to be a second concentration while executing ultrasonic treatment, and a process for coating the coating solution between a first electrode and a second electrode. The first concentration is $1 \times 10^{-4}$ g/ml or more. The second concentration is lower than $1 \times 10^{-5}$ g/ml.

A manufacturing method of a semiconductor device according to the present invention includes, a process for forming a transistor on a substrate, and a process for forming a carbon nanotube resistor according to the manufacturing method mentioned above so that the transistor and the second electrode is electrically connected.

A carbon nanotube resistor according to the present invention includes, a first electrode, a second electrode, and a mat layer arranged between the first electrode and the second electrode. In the mat layer, a carbon nanotube film whose thickness is 50 nm or less is provided.

A semiconductor device according to the present invention includes a transistor, and the carbon nanotube resistor mentioned above. The second electrode provided in the carbon nanotube resistor is electrically connected with the transistor.

According to the present invention, a manufacturing method of the carbon nanotube resistor is provided, which can uniformly disperse carbon nanotubes.

BEST MODE FOR CARRYING OUT THE INVENTION

First Exemplary Embodiment

Referring to the attached drawings, an exemplary embodiment of the present invention will be described below in detail.

Figure 1:
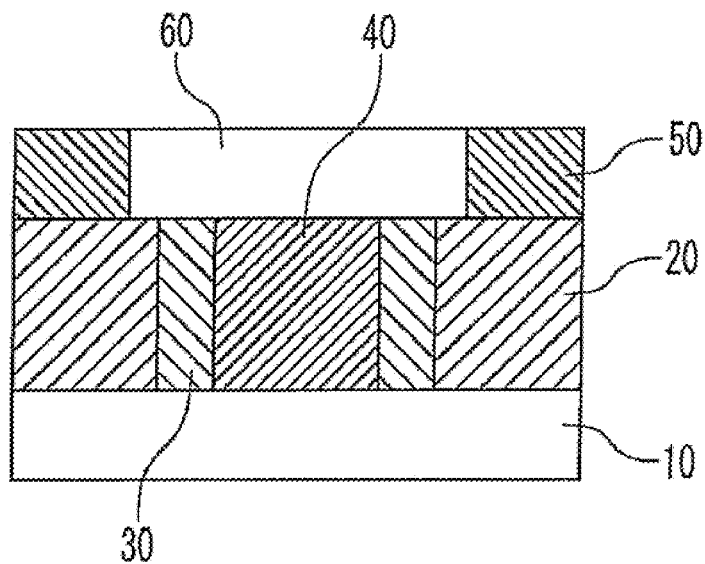
FIG. 1 is a sectional view showing a structure of a longitudinal nano-fuse in a related art.
Figure 2:
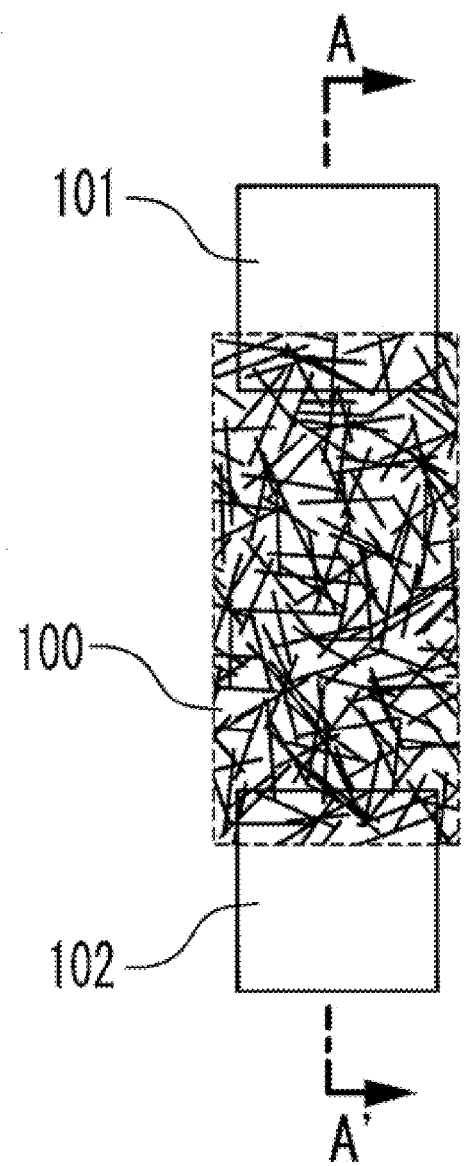
FIG. 2 is a plan view showing a carbon nanotube resistor according to a first exemplary embodiment.
Figure 3:
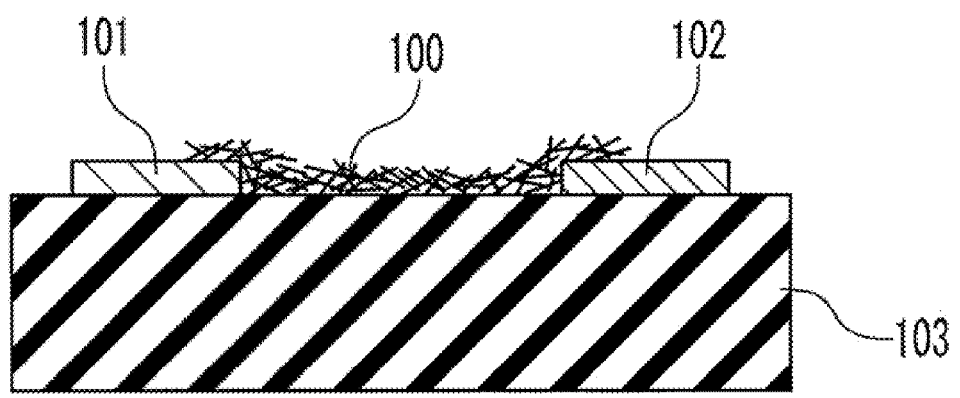
FIG. 3 is a sectional view showing a section along AA' shown in FIG. 2.

FIG. 2 is a plan view showing a configuration of a carbon nanotube resistor according to the present exemplary embodiment. FIG. 3 is a sectional view showing a section along AA' shown in FIG. 1. As shown in FIG. 2, the carbon nanotube resistor includes a first electrode 101, a second electrode 102, and a mat layer 100 arranged therebetween. As shown in FIG. 3, the first electrode 101, the second electrode 102, and the mat layer 100 are arranged on an insulator 103. As the insulator 103, a silicon oxide film or the like is illustrated.

The first electrode 101 and the second electrode 102 are metal electrodes. As a metal configuring the metal electrodes, Au and Pt are exemplified.

The mat layer 10C includes carbon nanotubes. Specifically, many carbon nanotube particles are randomly arranged in the mat layer 100. In the mat layer 100, only conductive carbon nanotube particles may be arranged, or a mixture of the conductive carbon nanotube particles and semiconductive carbon nanotube particles may be arranged.

A thickness of the mat layer 100 is 50 nm or less. If the thickness is within such range, when the resistor is used as a fuse, the mat layer 100 can be surely burned out by passing an electric current only one time. Thus, reliability of the fuse is enhanced. By the way, in the mat layer 100, carbon nanotube particles may overlap with each other along a thickness direction. As the carbon nanotubes, not only Single Walled Nanotube (SWNT) but also Multi Walled Nanotube (MWNT) can be used.

A length of each particle in a majority (for example, 50% or more in number) of the carbon nanotubes included in the mat layer 100 is preferably larger than 1/20 of a distance between the first electrode 101 and the second electrode 102. When the length is 1/20 of the distance or less, a resistance between the electrodes may be increased because nodes generated between carbon nanotube particles are excessive. As a result, a high voltage may be required for burning out.

Also, a diameter of each particle in a majority (for example, 50% or more in number) of the carbon nanotubes included in the mat layer 100 is preferably larger than 0 and is 10 nm or less. When the diameter is larger than 10 nm, it is difficult to form the mat layer 100 in a thickness of 50 nm or less.

Figure 4:
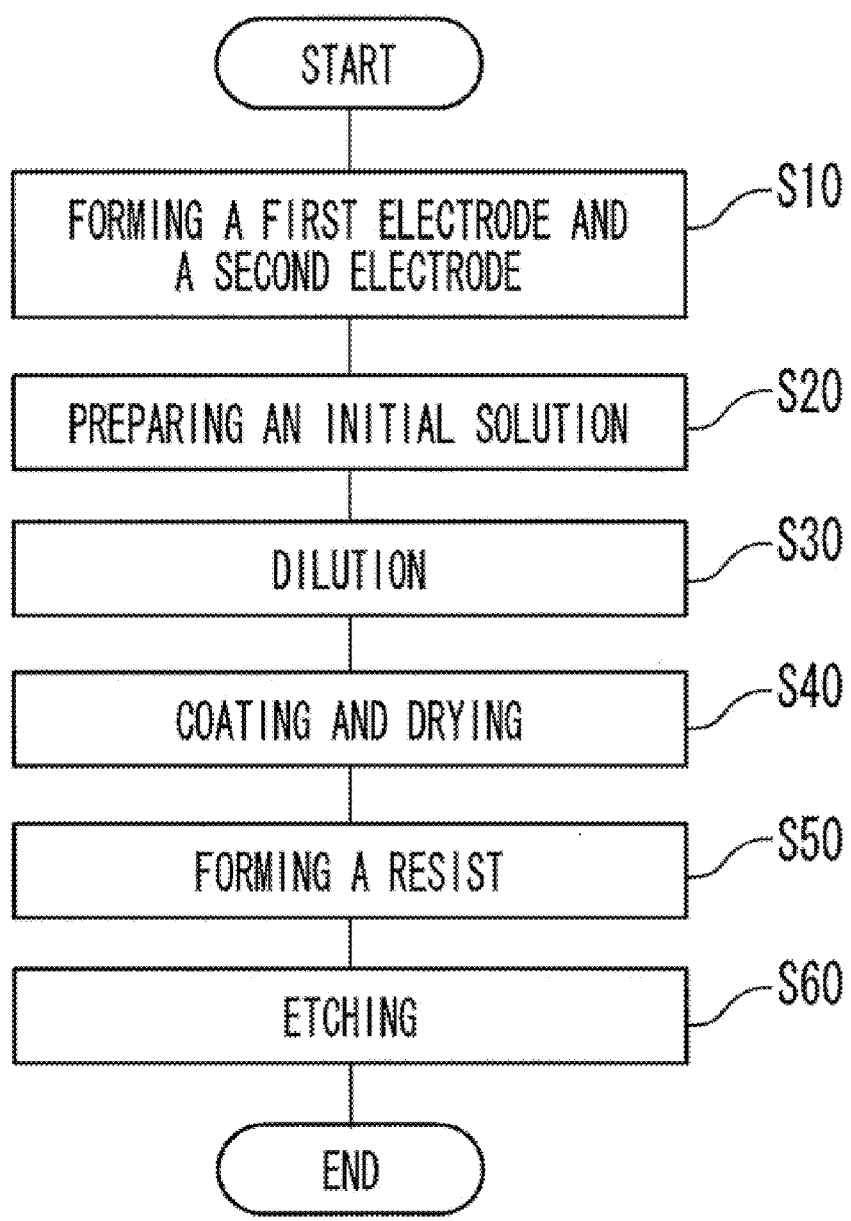
FIG. 4 is a flowchart showing a manufacturing method of a carbon nanotube resistor according to the first exemplary embodiment.
Figure 5A:
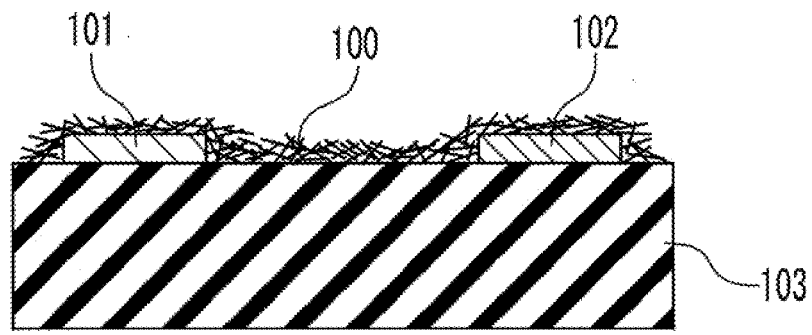
FIG. 5A is a sectional view showing the manufacturing method of the carbon nanotube resistor.
Figure 5B:
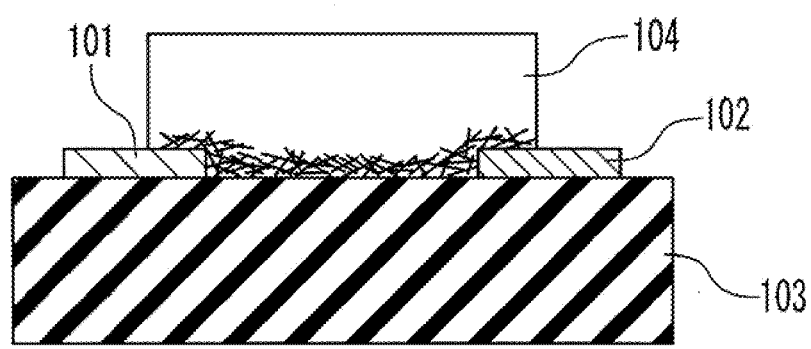
FIG. 5B is a sectional view showing the manufacturing method of the carbon nanotube resistor.
Figure 5C:
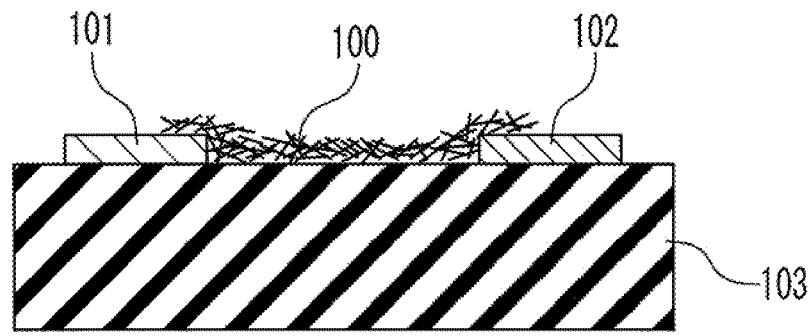
FIG. 5C is a sectional view showing the manufacturing method of the carbon nanotube resistor.

Next, a manufacturing method of carbon nanotube resistors (100 to 102) will be described below with reference to FIG. 4 and FIGS. 5A to 5C. FIG. 4 is a flowchart showing the manufacturing method of the carbon nanotube resistor. FIGS. 5A to 5C are sectional views showing the manufacturing method of the carbon nanotube resistor.

Step S10; Forming a First Electrode and a Second Electrode

At first, the first electrode 101 and the second electrode 102 are formed on the insulator 103.

Step S20; Preparing an initial Solution

Next, the carbon nanotubes used in the mat layer 100 are prepared. The carbon nanotubes can be prepared by a well known method such as a laser evaporation method. In the carbon nanotubes prepared by such method, usually, the semiconductive particles and the conductive particles are included at a rate of 3:1.

An initial solution is adjusted to be a first concentration, by introducing the carbon nanotubes prepared at S10 into a volatile solvent. The first concentration is $1 \times 10^{-4}$ g/ml or more. In the present exemplary embodiment, it is supposed that, the prepared carbon nanotubes of 1 mg are mixed into the volatile solvent of 5 ml, ultrasonic treatment is executed, and the initial solution is obtained thereby. That is, a concentration of carbon nanotube in the initial solution (first concentration) is $2 \times 10^{-4}$ g/ml. As the volatile solvent, for example, 1,2-dichloroethane, N,N-dimethyl-formamide and the like are illustrated.

Step S30; Diluting

Next, the initial solution prepared at S20 is stepwise diluted so that concentration becomes lower than $1 \times 10^{-5}$ g/ml, thereby a coating solution is obtained. Hereafter, there is a case that the concentration of the coating solution is referred to as a second concentration. In this exemplary embodiment, the second concentration is supposed to be $1 \times 10^{-6}$ g/ml.

Specifically, in the present exemplary embodiment, the coating solution is obtained by stepwise diluting as described below.

At first, the initial solution of 1.5 ml is extracted, and the extracted solution is diluted with 1,2-dichloroethane so as to be 30 ml. Thus, the concentration of the diluted solution becomes $1 \times 10^{-5}$ g/ml. Then, the diluted solution is treated by ultrasonic. Thereby, an intermediate solution is obtained. The concentration of the intermediate solution may be described as a third concentration.

3 ml of the intermediate solution is extracted. The extracted intermediate solution is diluted with 1,2-dichloroethane so as to be 30 ml. Thus, the concentration of the diluted extracted solution is $1 \times 10^{-6}$ g/ml. Then, the diluted extracted solution is treated by ultrasonic. Thereby, the coating solution is obtained.

By stepwise diluting, the carbon nanotubes are uniformly dispersed in the coating solution.

Step S40; Coating, Drying

Next, as shown in FIG. 5A, the coating solution prepared at S30 is coated on the insulator 103 on which the first electrode 101 and the second electrode 102 are formed, and drying is executed. The coating solution is coated by a spin coating. After vaporizing the volatile solvent, only the carbon nanotubes remain on the insulator 103. Since the concentration of the coating solution is lower than $1 \times 10^{-5}$ g/ml, a carbon nanotube film can be formed at a thickness of 50 nm or less. Since the carbon nanotubes are uniformly dispersed in the coating solution, the carbon nanotubes can be also uniformly dispersed on the insulator 103. Coating and drying are carried out a plurality of times (in the present exemplary embodiment, 12 times is supposed), and the carbon nanotube film in the thickness of 50 nm or less is formed on the insulator 103. If the coating and drying are carried out only one time, a density of the carbon nanotubes in the film will be too low to be continuity. The density of the carbon nanotubes in the carbon nanotube film can be adjusted by controlling the number of times of coating and drying. That is, when the number of times of coating and drying are increased, the density of the carbon nanotubes can be increased with keeping the carbon nanotubes uniformly. By the way, the coating is not limited to the spin coating. The other methods such as a dip coating and the like can be used.

Step S50, 60; Forming a resist, Etching.

Next, as shown in FIG. 5B, by a lithography method, a resist 104 is formed on an area on which the mat layer 100 is scheduled to be formed (step 550). Then, as shown in FIG. 5C, a part of carbon nanotube film is etched, which is not covered with the resist 104, and the carbon nanotube film remains on only the area on which the mat layer 100 is scheduled to be formed (Step S60). As the result, the mat layer 100 is formed. The carbon nanotube film is etched by an oxygen plasma process and the like.

By the processes described above, the carbon nanotube resistor (100 to 102) according to the present exemplary embodiment is manufactured. The inventors of the present invention measured the thickness of the mat layer 100 in the carbon nanotube resistor manufactured by the method according to the present exemplary embodiment. As a result, the thickness was 10 nm or less. It was confirmed that the carbon nanotubes were arranged in the mat layer 100 at the thickness of 50 nm or less.

According to the manufacturing method of the present exemplary embodiment, the mat layer 100 in which the carbon nanotubes are uniformly dispersed can be obtained. If the coating solution, whose concentration is between $1 \times 10^{-5}$ g/ml and $1 \times 10^{6}$ g/ml, is directly prepared at the diluting step (S30), a cohesion of the carbon nanotubes cannot be sufficiently suppressed even if the ultrasonic treatment is executed. As a result, the carbon nanotubes are not sufficiently dispersed in the mat layer 100. On the contrary, according to the present exemplary embodiment, the cohesion of the carbon nanotubes in the coating solution is sufficiently suppressed by stepwise diluting and the ultrasonic treatment at the step S30. As a result, the mat layer 100, in which the carbon nanotubes are uniformly dispersed, can be obtained. Actually, the surface state of the carbon nanotube resistor manufactured by the method according to the present exemplary embodiment was observed by a scanning electron microscope. As a result, it was confirmed that the carbon nanotubes were sufficiently dispersed.

By the way, in the present exemplary embodiment, the carbon nanotube concentration (the first concentration) in the initial solution is $2 \times 10^{-4}$ g/ml. However, a preferable range of the first concentration is between $1 \times 10^{-4}$ g/ml and $1 \times 10^{-3}$ g/ml. When the first concentration is lower than $1 \times 10^{-4}$ g/ml, a dilution rate in the diluting step is insufficient. Accordingly, it is difficult to uniformly disperse the carbon nanotubes in the coating solution. On the other hand, in the case of $1 \times 10^{-3}$ g/ml or more, the cohesion of the carbon nanotubes in the initial solution is excessively. Hence, the carbon nanotubes may not be sufficiently dispersed even if diluting.

In the present exemplary embodiment, the concentration of the carbon nanotubes in the coating solution (the second concentration) is $1 \times 10^{-6}$ g/ml. However, a preferable range of the second concentration is between $1 \times 10^{-6}$ g/ml and $1 \times 10^{-5}$ g/ml. If the second concentration is lower than $1 \times 10^{-6}$ g/ml, the density in the carbon nanotube film which is obtained by coating and drying one time at the step S40 is excessively small. Thus, it is difficult to obtain the carbon nanotube film in a desirable density. As a result, it is difficult to obtain a desirable electric property. On the other hand, in a case that the second concentration is $1 \times 10^{-5}$ g/ml or more, it is difficult to uniformly disperse the carbon nanotubes in the coating solution. Hence, it is difficult to obtain the mat layer 10 in which the carbon nanotubes are uniformly dispersed.

In the present exemplary embodiment, it is described that the concentration of the intermediate solution (the third concentration) is $1 \times 10^{-5}$ g/ml at the step S30. However, a preferable range of the third concentration is between $1 \times 10^{-5}$ g/ml and $1 \times 10^{-4}$ g/ml. If the third concentration is lower than $1 \times 10^{-5}$ g/ml, a dilution rate at diluting the intermediate solution is too small. Accordingly, it is difficult to sufficiently disperse the carbon nanotubes in the coating solution. On the other hand, if the third concentration is $1 \times 10^{-4}$ g/ml or more, a cohesiveness of the carbon nanotubes in the intermediate solution becomes too large. Hence, the sufficient dispersion is difficult even if the dilution and the ultrasonic treatment.

The carbon nanotube resistor according to the present exemplary embodiment provides a fuse having a high reliability, which can be surely burned out by passing an electric current one time. Because, according to the present exemplary embodiment, the mat layer 100 in which the carbon nanotubes are uniformly dispersed can be obtained, and a thickness of the mat layer can be 50 nm or less.

Figure 6:
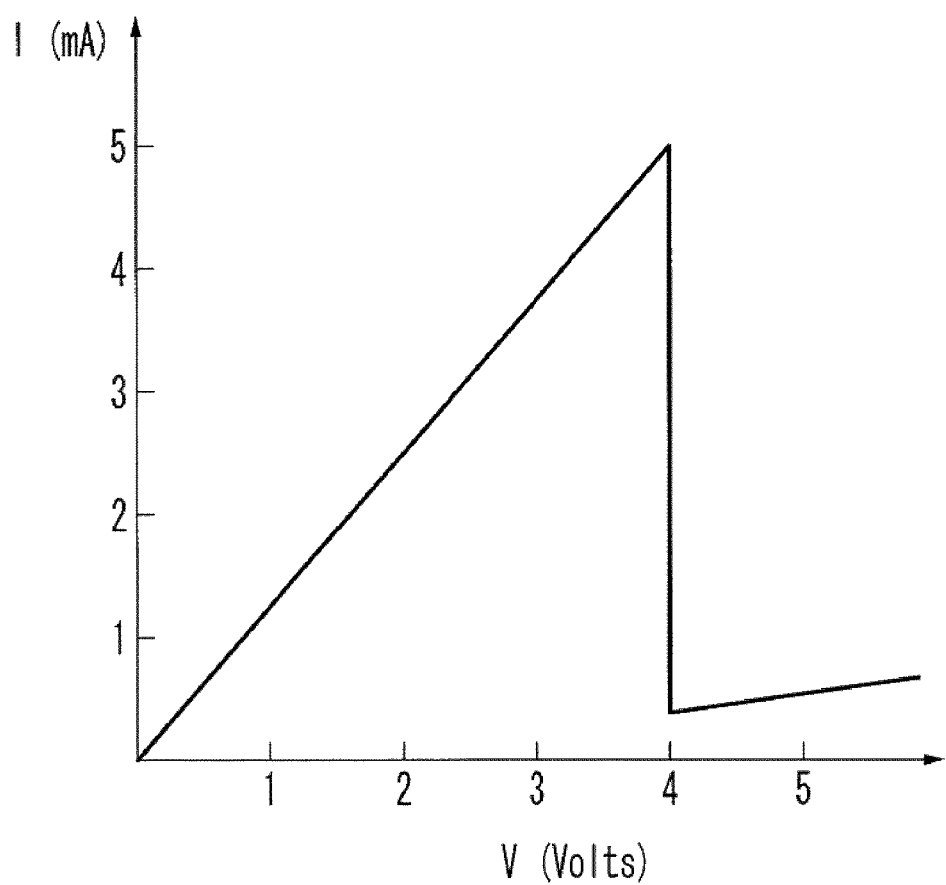
FIG. 6 is a diagram showing a relationship between a voltage and a current in the carbon nanotube resistor according to the first exemplary embodiment.

A property of the carbon nanotube resistor as the fuse will be described below with reference to FIG. 6. The carbon nanotube resistor according to the present exemplary embodiment was prepared, a voltage was applied between the first electrode 101 and the second electrode 102, and a current passing through the mat layer 100 was measured. FIG. 6 is a diagram showing a relationship between the applied voltage and the current. As shown in FIG. 6, when the applied voltage was about 4 V or less, the current was increased proportionally with the applied voltage. It was indicated that a resistance value of the mat layer 100 is a constant (in this example, about 800Ω). Also, the current value was sharply decreased when the applied voltage was about 9 V. It was indicated that a current path in the mat layer 100 was burned out by applying a voltage, of about 4V. The resistance value after the burning out was about 8 kΩ, which was equal to about 10 times of the resistance value before the burning out. Appling a difference between resistances, the carbon nanotube resistor can be used as a fuse, such as an anti-fuse in a circuit, or a memory.

Sharply change in the resistance value at a certain voltage (about 4V) indicates that the burning out is surely occur when the applied voltage is higher than the certain voltage. Thus, the fuse can be surely burned out by passing an electric current one time. The reason of sharply change in the resistance value is that the mat layer 100 in which the carbon nanotubes are uniformly dispersed is arranged at a thin thickness (50 nm or less). Reversely, if the thickness of the mat layer 100 is 50 nm or more and the carbon nanotubes in the mat layer 100 are not arranged uniformly, it is difficult to accurately control a voltage for burning out. The resistance value does not sharply change.

In the present exemplary embodiment, the carbon nanotubes are used as the mat layer 100. Thus, unlike the case of using a metal material and the like, an electromigration and a stressmigration do not occur. A wiring, to which a current is not supplied, is never disconnected. The resistor and the fuse which are high in reliability are obtained.

In the manufacturing method in the present exemplary embodiment, the volatile solvent is used. There is no need to introduce excessive components (for example; a cross-linker, a binder resin, a surfactant and the like) into the coating solution, except for the carbon nanotubes. In the mat layer 100, the excessive components do not deposit on the carbon nanotubes. When the excessive components deposit on the carbon nanotubes, there is fear of decreasing or increasing in the electric resistance. According to the present exemplary embodiment, the fear can be removed. Introducing no excessive component is preferable from a view of a cost for material.

In the present exemplary embodiment, a chemical process, such as a cross-linking reaction, is not carried out after coating the coating solution. That is preferable because a cost for the cross-linking reaction is unnecessary. Moreover, in case where the cross-linking process is carried out, a three-dimensional coupling structure is generated in the carbon nanotubes included in the mat layer. There is a fear that surely burning out is prevented. On the contrary, according to the present exemplary embodiment, the cross-linking process is not carried out. Thus, the fear is removed.

Second Exemplary Embodiment

Figure 7:
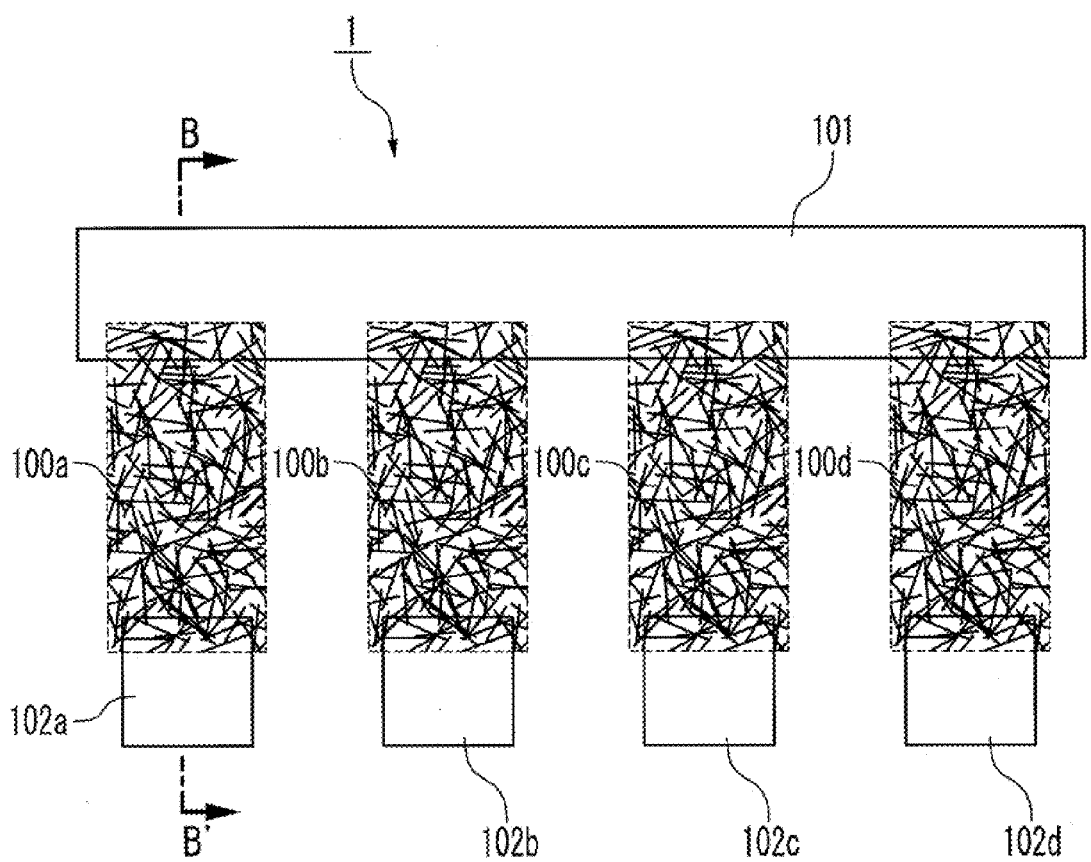
FIG. 7 is a plan view schematically showing a main portion of a semiconductor device according to a second exemplary embodiment.
Figure 8:
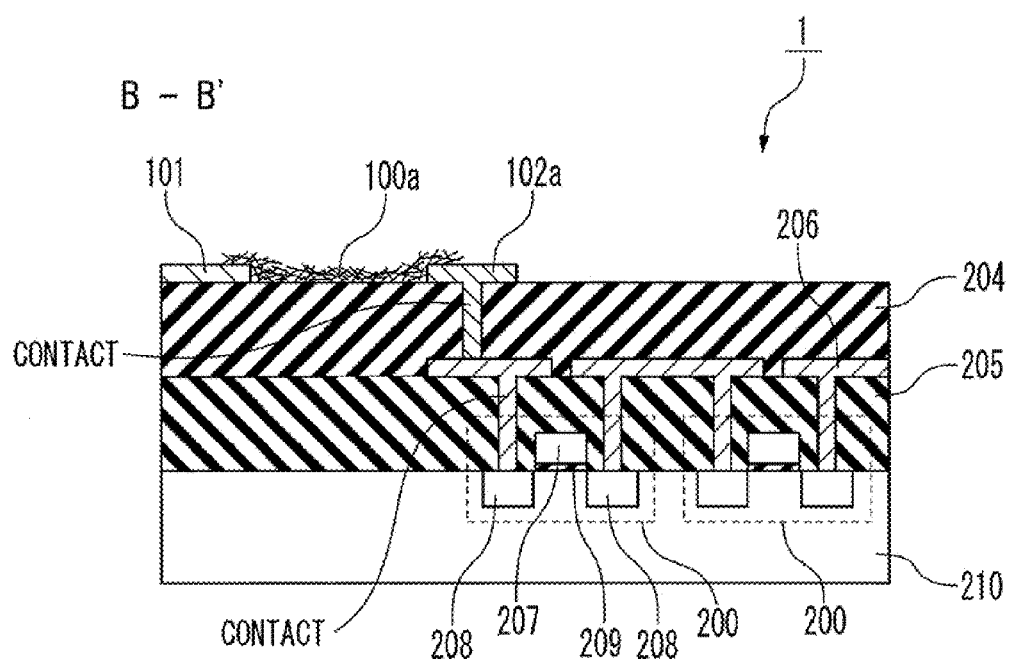
FIG. 8 is a sectional view showing a section along BB' shown in FIG. 7.

A second exemplary embodiment of the present invention will be described below with reference to FIGS. 7 and 8. FIG. 7 is a plan view schematically showing a main configuration of a semiconductor device 1 according to the present exemplary embodiment. FIG. 8 is a sectional view showing a section along BB' shown in FIG. 7. The semiconductor device 1 includes a plurality of carbon nanotube resistors (100 to 102) and a MOS (Metal Oxide Semiconductor) transistor 200. In FIG. 7, only the plurality of carbon nanotube resistors are illustrated, and illustration about the other portion is omitted.

As shown in FIG. 7, the plurality of carbon nanotube resistors (100 to 102) are arranged in the semiconductor device 1. Also, the plurality of carbon nanotube resistors (100 to 102) include, a common ground electrode (first electrode 101), a plurality of drawing electrodes (second electrodes 102a to d), and a plurality of mat layers 100a to d. Each of the plurality of mat layers 100a to d is arranged between each of the plurality of drawing electrodes 102a to d and the common earth electrode 101. The each mat layer 100 is same as the one described in the first exemplary embodiment. Thus, a detailed description about the each mat layer will be omitted.

A connection relation between the respective carbon nanotube resistors (100 to 102) and the MOS transistor 200 will be described below with reference to FIG. 8. The MOS transistor 200 is formed on a silicon substrate 210 and has a gate electrode 207, source and drain diffusion layers 208, and a gate insulating film 209. The MOS transistor 200 is embedded in a first insulating layer 205 formed on the silicon substrate 210. A first wiring layer 206 is formed on the first insulating layer 205. The first wiring layer 206 is embedded in a second insulating layer 204 formed on the first insulating layer 205. The plurality of carbon nanotube resistors (100 to 102) are provided on the second insulating layer 204. A conductive contact is provided in each of the first insulating layer 205 and the first wiring layer 206. The second electrode 102a in the carbon nanotube resistor is electrically connected with one of the source and drain diffusion layers 208 in the MOS transistor 200 via the contact and the first wiring layer 206.

According to such configuration, the respective carbon nanotube resistor (100 to 102) acts as an anti-fuse in the semiconductor device 1.

In case where the semiconductor device 1 according to the present exemplary embodiment is manufactured, at first, the silicon substrate 210 is prepared. Then, the MOS transistor 200, the first insulating layer 205, the first wiring layer 206, and the second insulating layer 204 are formed on the silicon substrate 210 in turn. As a method for forming, a well known method can be used. A substrate in which the MOS transistor 200 is formed is manufactured.

Next, the carbon nanotube resistors (100 to 102) are formed on the second insulating layer 204. The carbon nanotube resistors (100 to 102) can be formed by using the method described in the first exemplary embodiment. When forming the mat layer 100, heat enough to volatize the volatile solvent is only needed. A process for heating to over 100 degrees, such as CVD process, is not required. Accordingly, a property of the MOS transistor 200 is not changed by heat. According to the present exemplary embodiment, the carbon nanotube resistor can be arranged on an upper layer of the transistor, without losing reliability.

Third Exemplary Embodiment

Figure 9:
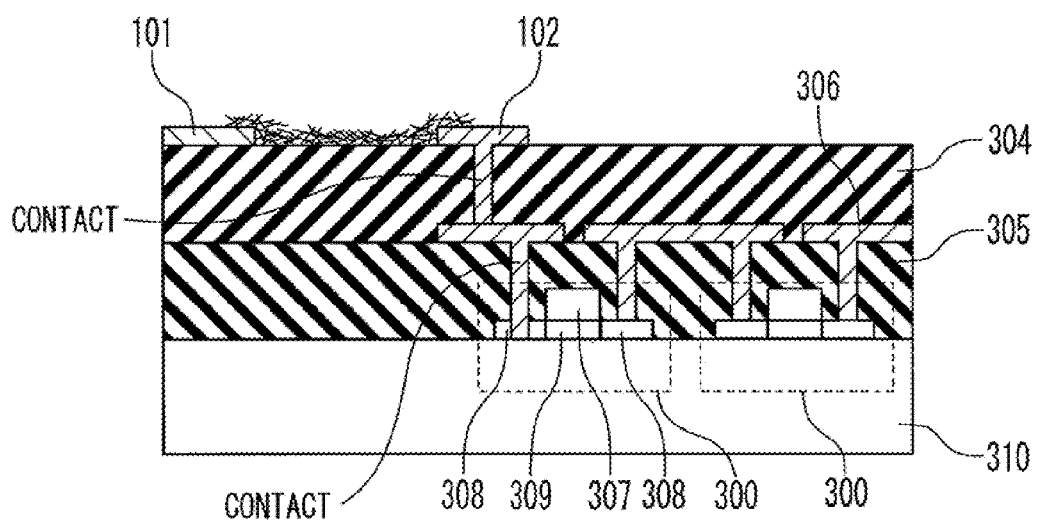
FIG. 9 is a sectional view schematically showing a main portion of a semiconductor device according to a third exemplary embodiment.

A third exemplary embodiment of the present invention will be described below with reference to FIG. 9. In the present exemplary embodiment, an organic transistor 300 is used instead of the MOS transistor 200 described in the second exemplary embodiment. Also, as shown in FIG. 9, a mother body is a plastic substrate 310. The organic transistor 300 is formed on the plastic substrate 310. As the plastic substrate 310, a polyethylene-naphthalate (PEN) substrate is exemplified. The organic transistor 300 includes, a gate electrode 307, a source and drain diffusion layers 308, and a channel member 309 exemplified as pentacene. Similarly to the second exemplary embodiment, one of the source and drain diffusion layers 308 is electrically connected with the carbon nanotube resistors (100 to 102) via a contact and a first wiring layer 306. Since other configurations are same as the ones described in the exemplary embodiments mentioned above, description about the other configurations is omitted.

The manufacturing method of the semiconductor device 1 according to the present exemplary embodiment will be described below. At first, a plastic substrate 310 is prepared. Then, a organic transistor 300, a first insulating layer 305, a first wiring layer 306, and a second insulating layer 304 are formed by using well known methods. After that, as well as the exemplary embodiments mentioned above, carbon nanotube resistors (100 to 102) are formed. When forming the carbon nanotube resistors, a process for heating to over 100 degrees such as CVD process is not required. Accordingly, change of a property in the MOS transistor 200 and damage of the plastic substrate 310 by heating are prevented. Namely, according to the present exemplary embodiment, the carbon nanotube resistor can be arranged on an upper layer of the organic transistor 300, without losing reliability of the substrate and the transistor.

The invention claimed is:

1. A method of manufacturing a carbon nanotube resistor, comprising:
   forming a first electrode and a second electrode;
   preparing an initial solution, by introducing carbon nanotubes into a volatile solution so that concentration becomes a first concentration and executing ultrasonic treatment;
   preparing an coating solution, by stepwise diluting said initial solution with a volatile solution so that concentration becomes a second concentration while executing ultrasonic treatment; and coating said coating solution between said first electrode and said second electrode,
wherein said first concentration is $1\times10^{-4}$ (g/ml) or more, and said second concentration is less than $1\times10^{-5}$ (g/ml).

2. The method according to claim 1, wherein said first concentration is lower than $1\times10^{-3}$ (g/ml).

3. The method according to claim 1, wherein said preparing said coating solution includes:
preparing an intermediate solution, by diluting said initial solution so that concentration becomes a third concentration and executing ultrasonic treatment; and
diluting said intermediate solution so that concentration becomes said second solution and executing ultrasonic treatment,
and said third concentration is $1\times10^{-5}$ (g/ml) or more and lower than $1\times10^{-4}$ (g/ml).

4. The method according to claim 1, wherein said second concentration is more than $1\times10^{-6}$ (g/ml).

5. The method according to claim 1, wherein said coating includes a plurality times of coating said coating solution.

6. A method of manufacturing a semiconductor device comprising:
forming a transistor on a substrate; and
forming said carbon nanotube resistor by the method according to claim 1 so that said transistor is electrically connected with said second electrode.

7. The method according to claim 6, wherein said substrate is made of plastic.

8. A carbon nanotube resistor comprising:
a first electrode;
a second electrode; and
a mat layer arranged between said first electrode and said second electrode,
wherein said mat layer includes a carbon nanotube film of which thickness is less than 50 nm,
wherein a length of each particle in a majority of carbon nanotubes included in said mat layer is larger than $\frac{1}{20}$ of a distance between said first electrode and said second electrode, and
wherein said majority means 50% or more in number.

9. A semiconductor device comprising:
a transistor, and
the carbon nanotube resistor according to claim 8,
wherein said carbon nanotube resistor is electrically connected with said transistor at said second electrode.

10. The semiconductor device according to claim 9, wherein said carbon nanotube resistor and said transistor are formed on a plastic substrate.

11. A carbon nanotube resistor comprising:
a first electrode;
a second electrode; and
a mat layer arranged between said first electrode and said second electrode,
wherein said mat layer includes a carbon nanotube film of which thickness is less than 50 nm,
wherein a diameter of each particle in a major of carbon nanotubes included in said mat layer is larger than 0 and is 10 nm or less, and
wherein said majority means 50% or more in number.

12. The carbon nanotube resistor according to claim 8, wherein a diameter of said each particle in majority of carbon nanotubes is larger than 0 and is 10 nm or less.

* * * * *